United States Patent
Richter et al.

(10) Patent No.: US 10,644,070 B2
(45) Date of Patent: May 5, 2020

(54) COMPONENT FOR DETECTING ELECTROMAGNETIC RADIATION

(71) Applicant: Fraunhofer-Gesellschaft zur Förderung der angewandten Forschung e.V., Munich (DE)

(72) Inventors: Bernd Richter, Dresden (DE); Philipp Wartenberg, Dresden (DE); Karsten Fehse, Dresden (DE); Matthias Jahnel, Dresden (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 99 days.

(21) Appl. No.: 15/579,326

(22) PCT Filed: Jun. 7, 2016

(86) PCT No.: PCT/EP2016/062865
§ 371 (c)(1),
(2) Date: Dec. 4, 2017

(87) PCT Pub. No.: WO2016/198382
PCT Pub. Date: Dec. 15, 2016

(65) Prior Publication Data
US 2018/0182811 A1 Jun. 28, 2018

(30) Foreign Application Priority Data
Jun. 9, 2015 (DE) .................. 10 2015 109 044

(51) Int. Cl.
*H01L 27/30* (2006.01)
*H01L 27/144* (2006.01)
(Continued)

(52) U.S. Cl.
CPC ........ *H01L 27/307* (2013.01); *H01L 27/1443* (2013.01); *H01L 27/281* (2013.01);
(Continued)

(58) Field of Classification Search
CPC . H01L 27/307; H01L 27/1443; H01L 27/281; H01L 27/288; H01L 31/1013; H01L 31/125; H01L 27/286
(Continued)

(56) References Cited

U.S. PATENT DOCUMENTS

| 4,651,001 A | 3/1987 | Harada et al. |
| 6,043,517 A | 3/2000 | Presting et al. |

(Continued)

FOREIGN PATENT DOCUMENTS

| DE | 35 33 146 A1 | 9/1985 |
| DE | 197 14 054 A1 | 10/1998 |

OTHER PUBLICATIONS

International Search Report with English translation, dated Sep. 27, 2016, pp. 1-3, issued in International Application No. PCT/EP2016/062865, European Patent Office, Rijswijk, Netherlands.
Bernd Richter et al., "Bidirectional OLED Microdisplay: Combining Display and Image Sensor Functionality into a Monolithic CMOS Chip," International Solid-State Circuits Conference, Session 17.8 Biomedical & Displays, 978-1-61284-302-5/11 dated Feb. 22, 2011, pp. 1-3, IEEE, San Francisco, CA.

*Primary Examiner* — Dzung Tran
(74) *Attorney, Agent, or Firm* — Brinks Gilson & Lione

(57) ABSTRACT

A component for detecting electromagnetic radiation comprising a first functional layer, in which at least one first element is embodied by which electromagnetic radiation of a first wavelength range can be detected, with the first functional layer being deposited on one side of the substrate. On the opposite side of the substrate a second functional layer is deposited, in which at least one second element is embodied by which either electromagnetic radiation of a second wavelength range can be detected, with the first functional layer and the substrate being transparent with (Continued)

regards to the electromagnetic radiation of the first wavelength range, or by which the electromagnetic radiation of a second wavelength range can be emitted.

20 Claims, 2 Drawing Sheets

(51) Int. Cl.
    *H01L 31/12*     (2006.01)
    *H01L 31/101*     (2006.01)
    *H01L 27/28*     (2006.01)

(52) U.S. Cl.
    CPC ........ *H01L 27/288* (2013.01); *H01L 31/1013* (2013.01); *H01L 31/125* (2013.01); *H01L 27/286* (2013.01)

(58) Field of Classification Search
    USPC .......................................................... 257/40
    See application file for complete search history.

(56) References Cited

U.S. PATENT DOCUMENTS

| | | |
|---|---|---|
| 2003/0209651 A1 | 11/2003 | Iwasaki |
| 2011/0043486 A1* | 2/2011 | Hagiwara ......... G02F 1/133514 345/175 |
| 2011/0279716 A1* | 11/2011 | Shintani ............ H01L 27/14621 348/272 |
| 2013/0056806 A1* | 3/2013 | Kim .................. H01L 27/14645 257/290 |
| 2013/0147764 A1 | 6/2013 | Chaji et al. |
| 2013/0229357 A1* | 9/2013 | Powell .................. G06F 3/0412 345/173 |
| 2015/0108508 A1 | 4/2015 | Wu et al. |
| 2015/0200226 A1* | 7/2015 | Jin .................... H01L 27/14645 257/432 |

\* cited by examiner

COMPONENT FOR DETECTING ELECTROMAGNETIC RADIATION

CROSS-REFERENCE TO RELATED APPLICATIONS

This application is a 371 nationalization of international patent application PCT/EP2016/062865 filed Jun. 7, 2016, the entire contents of which are hereby incorporated by reference, which in turn claims priority under 35 USC § 119 to German patent application DE 10 2015 109 044.9 filed on Jun. 9, 2015.

DETAILED DESCRIPTION

Figure 1:
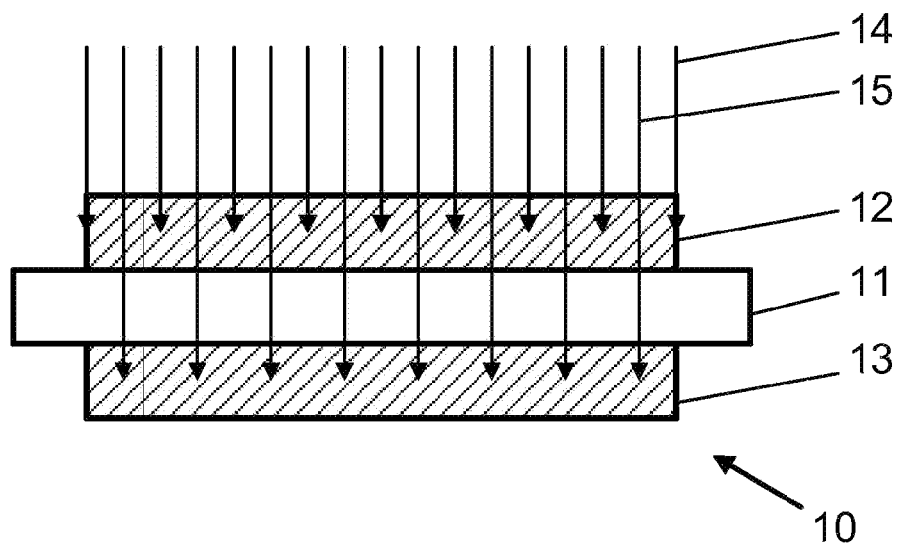
FIG. 1 a schematic section of the design of a component according to the invention with two detectors.

The invention relates to components for detecting electromagnetic radiation, which allow the realization of both multispectral sensors as well as sensor-emitter systems. Here, a multispectral sensor shall be understood as a component by which electromagnetic radiation can be detected from at least two different wavelength ranges and a sensor-emitter system shall be understood as a component which comprises at least one element detecting electromagnetic radiation as well as at least one element emitting electromagnetic radiation.

DE 10 2006 030 541 A1 describes a sensor-emitter system in which the elements emitting electromagnetic radiation and the elements detecting electromagnetic radiation are located jointly side-by-side on a chip. Both types of elements can be arranged in a matrix on the chip. Here it is disadvantageous that the directly abutting arrangement of elements emitting electromagnetic radiation and elements detecting electromagnetic radiation leads to over-coupling.

Bidirectional displays are known from WO 2012/163312 A1, on which several light-generating imaging elements and several light-detecting elements are arranged in the form of an array. Here the light-generating imaging elements in their entirety act for example as the display area of a display and the light detecting elements in their entirety for example act as sensors of a camera. Further, WO 2012/163312 A1 describes various control variants of the elements, which are intended to solve the problem of the direct cross-talk of light-generating imaging elements affecting abutting light-detecting elements by way of successively addressing the light-generating imaging elements and abutting light-detecting elements. This way, light-generating imaging elements and abutting light-detecting elements are actively operating only in successive alternation.

When the light-generating imaging elements of a bidirectional device serve as a display, the variants for controlling them disclosed in WO 2012/163312 A1 reach their limits.

In particular, the inactivity of the light-generating imaging elements during an exposure period of light-detecting elements, which requires a certain length of time to ensure good signal quality, can lead to noticeable interferences, however at least to a visible loss in brightness. The sensitivity of the detector elements in turn cannot be increased arbitrarily, since in display applications increasingly higher resolutions are required, with it being demanded that the chip area used remains as small as possible, for reasons of costs, so that here the space available for detector elements and/or technical circuitry measures to increase sensitivity is very limited.

Another problem of sensor-emitter systems of prior art in which elements detecting radiation and elements emitting radiation are arranged side-by-side is given in the low fill level with regards to the two functions. This means, both for detecting as well as emitting radiation, only a relatively small surface area is available in such a sensor-emitter system, because the other surface areas are already covered by elements of the respectively other function and/or by area sections required for wiring the elements.

The invention is therefore based on the technical problem of providing a component by which the disadvantages of prior art can be overcome. In particular, a component according to the invention shall allow the implementation of multispectral sensors by which electromagnetic radiation of different wavelength ranges can be detected, as well as sensor-emitter systems, which show a high fill level with regards to the function of detecting as well as the function of the emitting electromagnetic radiation.

In the component according to the invention the elements realizing the functions of detecting or emitting electromagnetic radiation are not arranged side-by-side within one layer, but for all elements realizing the very same function respectively a separate functional layer is formed, with the individual functional layers being arranged horizontally over top of each other. This way, a higher fill level can be achieved for the elements realizing a function in reference to prior art.

A component according to the invention comprises therefore a first functional layer, within which at least one first element is formed, allowing the detection of electromagnetic radiation from a first wavelength range, with the first functional layer being deposited on one side of the substrate. Preferably the first functional layer comprises a plurality of first elements detecting electromagnetic radiation, which are arranged preferably distributed in a grid over the first functional layer. Here, all components are suitable as detector elements which can be formed within a functional layer and by which electromagnetic radiation can be detected. For example, a detector element can be formed as a photodiode or as a photo-field effect transistor. With these detector elements of the first functional layer, for example, electromagnetic radiation can be detected of the range of infrared radiation, the range of radiation that can be detected with the human eye, the range of X-ray radiation, or the range of ultraviolet radiation. A component according to the invention also comprises a second functional layer, within which at least one second element is formed, by which either electromagnetic radiation can be detected of a second wavelength range, with the first functional layer and the substrate being transparent with regards to electromagnetic radiation of the second wavelength range, or by the second element electromagnetic radiation of a second wavelength range can be emitted. Here the second functional layer is deposited at the side of the substrate that is located opposite the first functional layer. Preferably the second functional layer also comprises a plurality of second elements, all of which performing either the function of detecting electromagnetic radiation or the function of emitting electromagnetic radiation. The plurality of second elements is also arranged preferably in the form of a grid distributed over the area of the second functional layer. The second wavelength range can for example be selected from the range of infrared radiation, the range of radiation that can be detected with the human eye, the range of X-ray radiation, or the range of ultraviolet radiation.

A functional layer comprising elements that detect electromagnetic radiation is hereinafter also called the detector layer or abbreviated the detector, and a functional layer comprising elements emitting electric radiation is called the emitter layer or abbreviated the emitter.

When the first functional layer and the second functional layer are respectively embodied as detectors, the first wavelength range is preferably distinguished from the second wavelength range. Using such a component according to the invention then allows the detection of the electromagnetic radiation impinging the component from the side of the first functional layer in two different wavelength ranges.

Preferably the first functional layer and the second functional layer are made from an organic material. Processing steps to form elements (inside an organic layer) by which electromagnetic radiation can be detected or electromagnetic radiation can be emitted are known from prior art. In one embodiment the organic material, from which the first functional layer and/or the second functional layer are made, comprises also nanoparticles, which are embedded inside the organic material. Such nanoparticles can for example be embodied as so-called quantum-nanoparticles (also called quantum-nano dots or abbreviated QND). Synthetic materials or glasses are suitable substrate materials. However, a semiconductor substrate (for example a silicon substrate) is preferred as the substrate of a component according to the invention.

In one embodiment a circuitry is provided inside the substrate, comprising active components (such as a CMOS-structure) as well as at least one connection level comprising a plurality of conductors. The semiconductor substrate comprises also at least one feedthrough, by which a detector element or an emitter element of one functional layer is connected via a conductor of the connection layer inside the substrate in an electrically conducting fashion.

Figure 2:
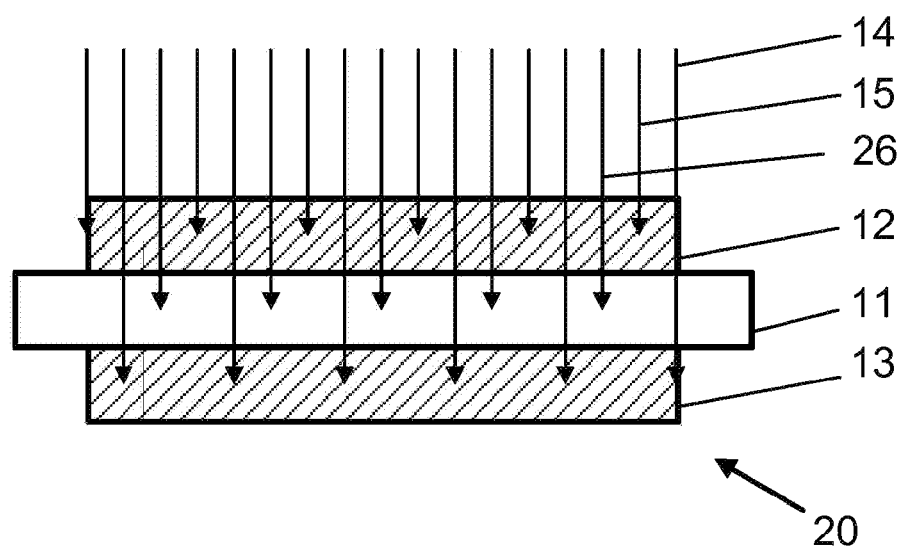
FIG. 2 a schematic section of the design of a component according to the invention with two detectors and a substrate embodied as a detector.
Figure 3:
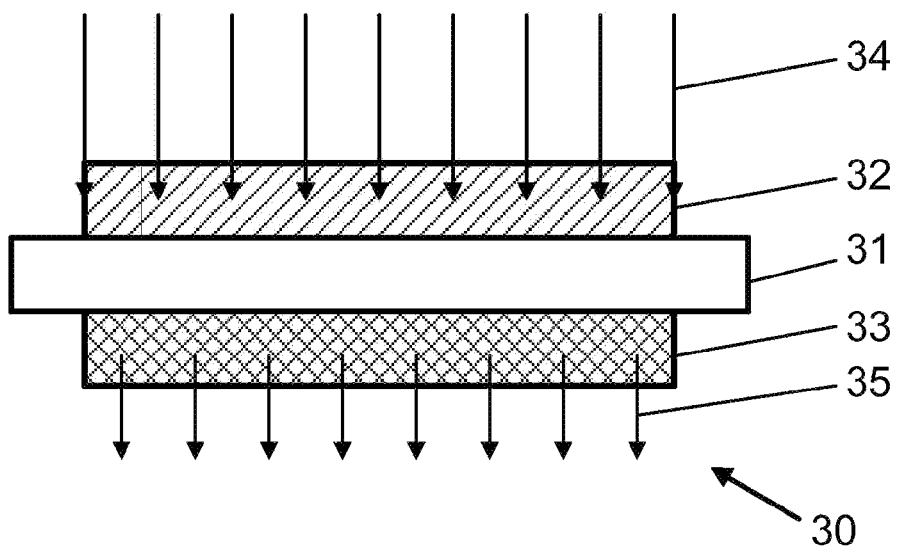
FIG. 3 a schematic section of the design of a component according to the invention with a detector and an emitter.
Figure 4:
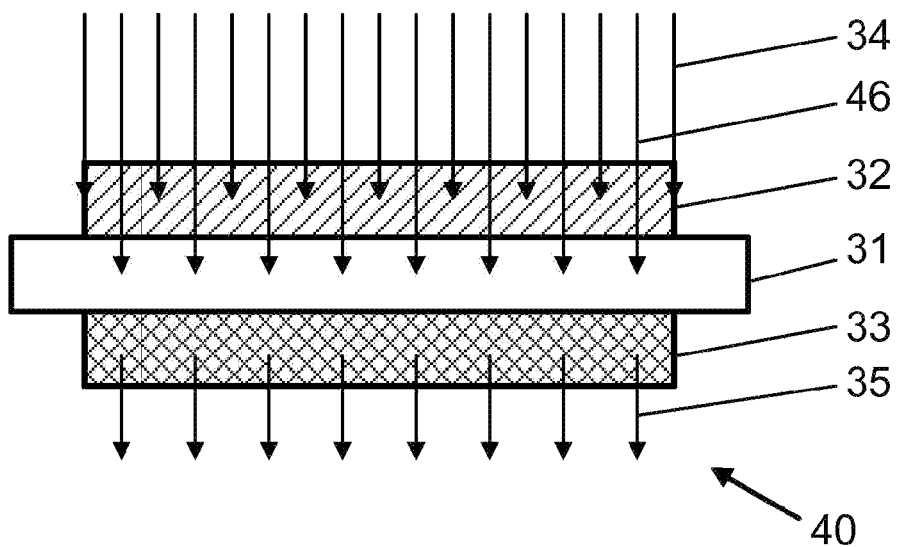
FIG. 4 a schematic section of the design of a component according to the invention with a detector and an emitter as well as a substrate embodied as a detector.

In the following, the present invention is explained in greater detail based on exemplary embodiments. The figures show:

FIG. 1 a schematic section of the design of a component according to the invention with two detectors;

FIG. 2 a schematic section of the design of a component according to the invention with two detectors and a substrate embodied as a detector;

FIG. 3 a schematic section of the design of a component according to the invention with a detector and an emitter;

FIG. 4 a schematic section of the design of a component according to the invention with a detector and an emitter as well as a substrate embodied as a detector.

FIG. 1 shows schematically a component 10 according to the invention in a sectioned form. The component 10 comprises a substrate 11, on the one side of which a first functional layer 12 and on the other side of which a second functional layer 13 are deposited. Both functional layers 12 and 13 are made from an organic material. A plurality of first photodiodes, not shown in FIG. 1, is formed inside the functional layer 12, which are arranged distributed in a grid over the area of the functional layer 12, and by which electromagnetic radiation 14 can be detected from a first wavelength range, such as the ultraviolet wavelength range. The functional layer 12 is therefore embodied as a detector for UV-radiation.

Inside the functional layer 13 a plurality of second photodiodes is formed, not shown in FIG. 1 either, which are arranged distributed in a grid over the area of the functional layer 13 and by which electromagnetic radiation 15 can be detected from a second wavelength range, such as the infrared wavelength range. The functional layer 13 is therefore also embodied as a detector, but this time for IR-radiation. The substrate 11 and the functional layer 12 are additionally transparent with regards to IR-radiation. With the component 10 therefore both UV-radiation as well as IR-radiation can be detected, which impinge the component 10 from the side of the functional layer 12.

The substrate 11 comprises a silicon material, which already shows a CMOS-structure and thus a logic device, which is used for controlling the photodiodes formed inside the functional layers 11 and 12. On the side of the substrate 11 abutting the functional layer 12 a wiring layer is formed, not shown in FIG. 1 either, by which conductors generate the contacts of the photodiodes formed in the functional layers. Here, the photodiodes formed in the functional layers 12 are directly in contact with the abutting conductors of the wiring layer, while the photodiodes embodied inside the functional layer 13 are in contact via so-called through-silicon-vias (hereinafter called "TSVs") through the substrate 11 with the conductors of the wiring level. For reasons of completeness, it shall be mentioned that processing steps for generating a circuitry of active components and a wiring level inside a substrate made from semiconductor material and processing steps for generating contacts through such a substrate are well known.

The use of the wiring level of a substrate for switching photodiodes arranged inside functional layers arranged over top of each other allows a high fill factor of each functional layer with elements detecting electromagnetic radiation in reference to optoelectronic components of prior art, in which the wiring occurs within the functional layer itself. Thus, the component 10 realizes a multispectral sensor with increased resolution in reference to prior art.

FIG. 2 shows an alternative multispectral sensor 20, which initially shows all features of the multispectral sensor 10 of FIG. 1. However, additionally the multispectral sensor 20 shows inside the substrate 11 a plurality of third photodiodes, not shown in FIG. 2, which are arranged distributed in a grid over the area of the substrate 11 and by which electromagnetic radiation 26 can be detected of the wavelength range that can be detected with the human eye. The substrate 11 is therefore also formed as a detector for electromagnetic radiation from a third wavelength range. Processing steps for forming photodiodes inside the semiconductor substrate are also known from prior art. The wiring of the third photodiodes inside the substrate 11 occurs also by way of the wiring level, which is formed at one side of the substrate 11, as already described for FIG. 1. With a multispectral sensor 20 therefore electromagnetic radiation of three different wavelength ranges can be detected, which impinge the component 20 from the side at which the functional layer 12 is deposited. For this purpose it is additionally required that the functional layer 12 is embodied transparently for the electromagnetic radiation which is detected by the third photodiodes inside the substrate 11.

FIG. 3 shows another alternative component 30 according to the invention in a schematic fashion, which is formed as a sensor-emitter system. The component 30 comprises a substrate 31 made from a semiconductor material on a silicon basis, within which a CMOS-structure, a wiring level, and a TSV-feedthrough are already embodied, as described for the substrate 11 of FIG. 1. On one side of the substrate 31 a first functional layer 32 comprising an organic material is deposited, within which a plurality of first photodiodes is embodied, not shown in FIG. 3, which diodes are arranged distributed in a grid over the area of the functional layer 32, and via which electromagnetic radiation 34 can be detected of a first wavelength range, such as the infrared wavelength range. The functional layer 32 is therefore embodied as a detector for IR-radiation. The photodiodes inside the functional layer 32 are in contact with the conductors of the wiring level of the substrate 31 and are controlled via the CMOS-circuit embodied inside the substrate 31.

On the other side of the substrate 31 a second functional layer 33 comprising an organic material is deposited. Inside the functional layer 33 a plurality of photodiodes is formed, not shown in FIG. 1, which diodes are arranged distributed in a grid over the area of the functional layer 12 and by which the electromagnetic radiation 35 of the wavelength range is emitted, which is visible to the human eye. The functional layer 33 is therefore embodied as an emitter. Via the TSVs embodied in the substrate 31 the photodiodes of the functional layer 33 are in contact with the conductors of the wiring level and controlled via the CMOS-circuit in the substrate 31. The sensor emitter system 30 can for example be used as an image converter in night-vision devices, by evaluating the data of the IR-radiation image detected by the sensor 32 with the CMOS-circuit in the substrate 31 and displaying a radiation image on the emitter 33, which can be detected by the human eye.

An alternative sensor-emitter system 40 is shown schematically in FIG. 4, which at first shows all features of the sensor-emitter system 30 of FIG. 3. However, additionally the sensor-emitter system 40 shows inside the substrate 31 a plurality of third photodiodes, not shown in FIG. 4, which diodes are arranged distributed in a grid over the area of the substrate 31 and by which electromagnetic radiation 46 of the ultraviolet wavelength range can be detected. The substrate 31 is therefore also embodied as a detector for electromagnetic radiation of the UV-wavelength range. The wiring of the third photodiodes inside the substrate 31 occurs via the wiring level, which is embodied at one side of the substrate 31. Therefore, with a sensor-emitter system according to the invention, as depicted in FIG. 4, radiation images of two different wavelength ranges can be detected via the detectors 31 and 32 and displayed separately or also accumulated as a radiation image in a third wavelength range using the emitter 33.

It shall be mentioned that the wavelength ranges mentioned in FIGS. 1 to 4 and allocated to the individual detectors and emitters were only mentioned as examples with regards to electromagnetic radiation. The individual detectors and emitter can however also be allocated to any other arbitrary wavelength range of electromagnetic radiation that is detectable with known sensor and/or emitted by known emitters.

The invention claimed is:

1. A component comprising:
   a substrate;
   a first functional layer within which at least a first element acting as a photodiode or photo field effect transistor is formed, wherein electromagnetic radiation of a first wavelength range is detectable by the first element, the first wavelength range is the infrared range, the ultraviolet range, or the range of X-ray radiation, and wherein the first functional layer is on one side of the substrate; and
   a second functional layer on a side of the substrate that is opposite the first functional layer, wherein at least a second element is formed within the second functional layer, and the second element is configured to emit electromagnetic radiation of a second wavelength range, the second wavelength range is detectable by the human eye, wherein the first wavelength range differs from the second wavelength range, wherein the electromagnetic radiation of the second wavelength range that is emitted by the second element is undetectable by the first element or any other element of the first functional layer within reach of the electromagnetic radiation of the second wavelength range that is emitted by the second element.

2. The component according to claim 1, wherein the substrate is embodied as a glass or synthetic substrate.

3. The component according to claim 1, wherein the substrate comprises a semiconductor material and includes a circuitry of active elements.

4. The component according to claim 1, wherein the substrate comprises at least one wiring level.

5. The component according to claim 1, wherein the substrate comprises at least one feedthrough.

6. The component according to claim 1, wherein inside the substrate at least one third element is formed, wherein electromagnetic radiation of a third wavelength range is detectable by the at least one third element.

7. The component according to claim 6, wherein the third wavelength range is different from the first and the second wavelength range and the first functional layer is transparent with regards to the electromagnetic radiation of the third wavelength range.

8. The component according to claim 1, wherein inside the first functional layer, inside the second functional layer, and/or inside the substrate a plurality of respectively allocated first elements, second elements, and/or third elements is formed, which are arranged in a grid over an area of the respective functional layer and/or over an area of the substrate.

9. The component according to claim 1, wherein the first functional layer and/or the second functional layer comprise an organic material.

10. The component according to claim 9, wherein the first functional layer and/or the second functional layer comprise nanoparticles.

11. An image converter comprising:
    a substrate;
    a first functional layer including plurality of detectors on a first side of the substrate, wherein the detector is detectors are configured to detect electromagnetic radiation of a first wavelength range received from outside the component in a direction towards a surface of the first side of the substrate that faces away from the substrate; and
    a second functional layer including a plurality of emitters on a second side of the substrate opposite of the first side, wherein the emitters are configured to emit electromagnetic radiation of a second wavelength range in a direction away from a surface of the second side that faces away from the substrate, wherein the first wavelength range differs from the second wavelength range and the emitters are configured to emit an image that is converted from an image detected by the detectors.

12. The image converter according to claim 11, wherein the substrate is embodied as a glass or synthetic substrate.

13. The image converter according to claim 11, wherein the substrate comprises a semiconductor material and includes a circuitry of active elements.

14. The image converter according to claim 11, wherein the substrate comprises at least one wiring level.

15. The image converter according to claim 11, wherein the substrate comprises at least one feedthrough.

16. The image converter according to claim 11, wherein inside the substrate at least one element is formed, wherein electromagnetic radiation of a third wavelength range is detectable by the at least one element.

17. The image converter according to claim 16, wherein the third wavelength range is different from the first and the second wavelength ranges and the first functional layer is transparent with regards to the electromagnetic radiation of the third wavelength range.

18. The image converter according to claim 11, wherein the first functional layer and/or the second functional layer comprise(s) an organic material.

19. The image converter according to claim 18, wherein the first functional layer and/or the second functional layer comprise(s) nanoparticles.

20. The image converter according to claim 11, wherein the first wavelength range is outside of the human visible spectrum, and the second wavelength range is within the human visible spectrum.

* * * * *